(12) United States Patent
Hosokawa

(10) Patent No.: US 6,348,941 B1
(45) Date of Patent: Feb. 19, 2002

(54) PRINTING PLATE EXPOSURE APPARATUS FOR RECORDING IMAGE DATA SPIRALLY

(75) Inventor: Junichi Hosokawa, Chiba-ken (JP)

(73) Assignee: Kabushiki Kaisha Kaneda Kikai Seisakusho, Toyonaka (JP)

( * ) Notice: Subject to any disclaimer, the term of this patent is extended or adjusted under 35 U.S.C. 154(b) by 0 days.

(21) Appl. No.: 09/349,985

(22) Filed: Jul. 9, 1999

Related U.S. Application Data

(62) Division of application No. 08/865,032, filed on May 29, 1997, now Pat. No. 5,978,010.

(30) Foreign Application Priority Data

Nov. 6, 1996 (JP) .............................................. 8-293494

(51) Int. Cl.$^7$ ................................................ B41J 2/435
(52) U.S. Cl. .................... 347/248; 347/250; 101/463.1; 355/47; 358/299
(58) Field of Search ................................ 347/248, 262, 347/264, 250, 255, 256; 346/76.1, 150.2; 358/297, 299, 300, 480, 481; 359/495, 497; 371/1; 355/85, 86, 87, 89, 47; 101/463.1

(56) References Cited

U.S. PATENT DOCUMENTS

| | | | |
|---|---|---|---|
| 4,819,018 A | 4/1989 | Moyroud et al. | 347/22 |
| 4,822,151 A | 4/1989 | Tatsuno et al. | 359/495 |
| 5,550,574 A | 8/1996 | Dillow | 347/262 |
| 6,151,099 A | * 11/2000 | Okamura et al. | 355/47 |

* cited by examiner

Primary Examiner—N. Le
Assistant Examiner—Lamson D. Nguyen
(74) Attorney, Agent, or Firm—Griffin & Szipl, P.C.

(57) ABSTRACT

Distortions, wherein a recording image is inclined relative to a printing plate, are removed when image data from a computer are recorded spirally in recording bands, having a predetermined band width, of a plurality of picture elements on the printing plate which is wound on a drum. Printing plate exposure apparatus comprises the printing plate being wound spirally on the drum such that an extension line of a side edge line of the printing plate is shifted a band width after one drum revolution. The printing plate exposure apparatus further includes: an exposure unit for recording the image data in the recording bands on the printing plate; a moving mechanism for moving the exposure unit by one band width along a drum axial direction relative to the drum during one revolution of the drum; and a timing mechanism for adjusting a band recording start position of the image data for each rotation of the drum so as to set a top edge line of the recording image parallel to a top edge line of the printing plate.

8 Claims, 11 Drawing Sheets

PRINTING PLATE EXPOSURE APPARATUS FOR RECORDING IMAGE DATA SPIRALLY

This application is a divisional application of U.S. patent application Ser. No. 08/865,032, filed May 29, 1997, now U.S. Pat. No. 5,978,010.

BACKGROUND OF THE INVENTION

The present invention relates generally to a printing plate exposure apparatus for recording image data of printing image signals from a computer on printing plates on curved surfaces of drums.

1. Prior Art

Recently, with advances in the technologies of data processing and image processing by computers, a method of effecting a drawing directly on a printing plate with a laser beam by use of image signals from a computer, without interposition of photographic film, has been invented and put to practical use, even in the field of newspaper printing and the like.

Also, a well known printing plate called a PS plate—i.e., a printing plate for which a photo-sensitive material is pre-coated on an aluminum base plate—is commonly used.

Conventionally a well known drum rotary system for facsimile apparatus is used as a mechanism for drawing on such printing plates. Although a laser beam is used for drawing on the printing plate on the drum, technology has advanced such that a system of using a plurality of beams, rather than one beam, has been adopted for increasing drawing speed. Hence, as a conventional example, a system of recording data in a band shape with a plurality of laser beams, is described hereinafter.

As described above, a multi-beam system shown in FIG. 11 is known as an apparatus for drawing picture images on a printing plate. Reference numeral 2 is a horizontally arranged drum 2 to be rotationally driven in a direction of an arrow "a" by a motor M, with a printing plate 4 being wound on an external circumferential face of the drum 2.

Since the printing plate 4 is wound in a regular cylindrical shape such that a start side edge line 6 of the printing plate 4 and an end side edge line 8 thereof are not skewed, a top edge line 10 of the printing plate and a bottom edge line 12 thereof are positioned in parallel to each other in a drum axial direction.

An optical apparatus is mounted on an optical stand 14. A laser beam coming from a laser light source 16, such as a semiconductor laser or the like, is divided into multi-beams by a multi-beam producing element 18, such as a grating, a Wollaston polarizing prism or the like. The multi-beam passes through an AOM group (acoustical optical modulator) 20 which is switch-controlled by image signals from the computer C. Then, the beams enter into an exposure unit 22 including a light source array made of optical fibers and are irradiated onto the printing plate 4 through a lens 24. The light source array 22 is an example of an exposure unit for directly recording images onto the printing plate. An image band 26 is recorded on the printing plate 4 within a band width B corresponding to an irradiation width of the multi-beam. A moving mechanism H causes the optical stand 14 to continuously move at a uniform speed in a direction of an arrow "b" a distance of the band width B for one revolution of the drum 2.

2. Problems to be Solved by the Invention

The aforementioned exposure apparatus has the following problems. As shown in FIG. 12, the drum 2 rotates at a uniform speed while the optical stand 14 moves the distance of the band width B per revolution. Therefore, the image band 26 is spirally recorded on the printing plate 4, axially shifting a distance of the band width B for one revolution. When the printing plate 4 is unfolded (flattened), a recording image 28, composed of many image bands 26 is formed in the shape of a parallelogram, distorted by a distance of the band width B due to the spiral recording operation. The printing plate, having such a deformation of the recording image 28 relative to the printing plate 4, cannot be adopted for printing use.

For a printing plate for newspaper use, when a circumference of the drum is 46 inches, a picture element density is 909 dots per inch and a light source array 22 has 128 beams, the band width B is the equivalent of 128 picture elements, i.e. 128/909=0.14 inch, or 3.6 mm. The spiral recording results in a distortion of 3.6 mm, which is not visually negligible, between a top edge line 28c of the recording image 28 and a bottom edge line 28d thereof. An inclination angle θ is 0.17 degrees, as calculated from tan θ=0.14/46, and hence, a start side edge line 28a and an end side edge line 28b, both parallel to each other, have the inclination of 0.17 degrees.

In order to remove the inclination of the start side edge line 28a of the image with respect to the start side edge line 6 of the printing plate 4, an intermittent moving system shown in FIG. 13 has been invented. Namely, movement of the optical stand 14 is stopped while one revolution of the drum 2 for image recording takes place. Then, the optical stand 14 is moved through a distance of the band width B by the moving mechanism H. The moving time has to be set at an integral multiple of time required for one revolution of the drum. If this intermittent moving system is adopted, a recording image 28 is recorded in a regular square shape 2. The recording image 28 is not distorted with respect to the printing plate 2, because the image bands 26 are formed in regular circumferential shapes, not in the spiral shapes. But, the intermittent movement has a problem in that efficiency of such a plate making operation is lowered because an overall exposure time is several times longer than for the spiral recording method.

Also, a necessity for repeatedly starting and stopping movement of the heavy optical system makes the apparatus complicated and higher in price. This also causes vibrations which are likely to cause deterioration of images and malfunctions of the apparatus.

SUMMARY OF THE INVENTION

A printing plate exposure apparatus of this invention eliminates the aforementioned problems. A printing plate exposure apparatus in which image data is recorded spirally on a surface of a printing plate wound on a drum to have a band width of a plurality of picture elements comprises basically: the printing plate being wound spirally on the drum such that when one revolution of the drum is completed an extension line of a side edge line of the printing plate is shifted by a distance of the band width; an exposure unit for recording the image data in a band shape on the printing plate; a moving mechanism for relatively moving the exposure unit a distance of the band width in a drum axial direction, relative to the drum, for each revolution of the drum; and a timing mechanism for adjusting, for each revolution of the drum, a recording start position of the band for recording the image data so that a top edge line of a recording image is parallel with, at an equal interval from, a top edge line of the printing plate.

BRIEF DESCRIPTION OF THE DRAWINGS

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
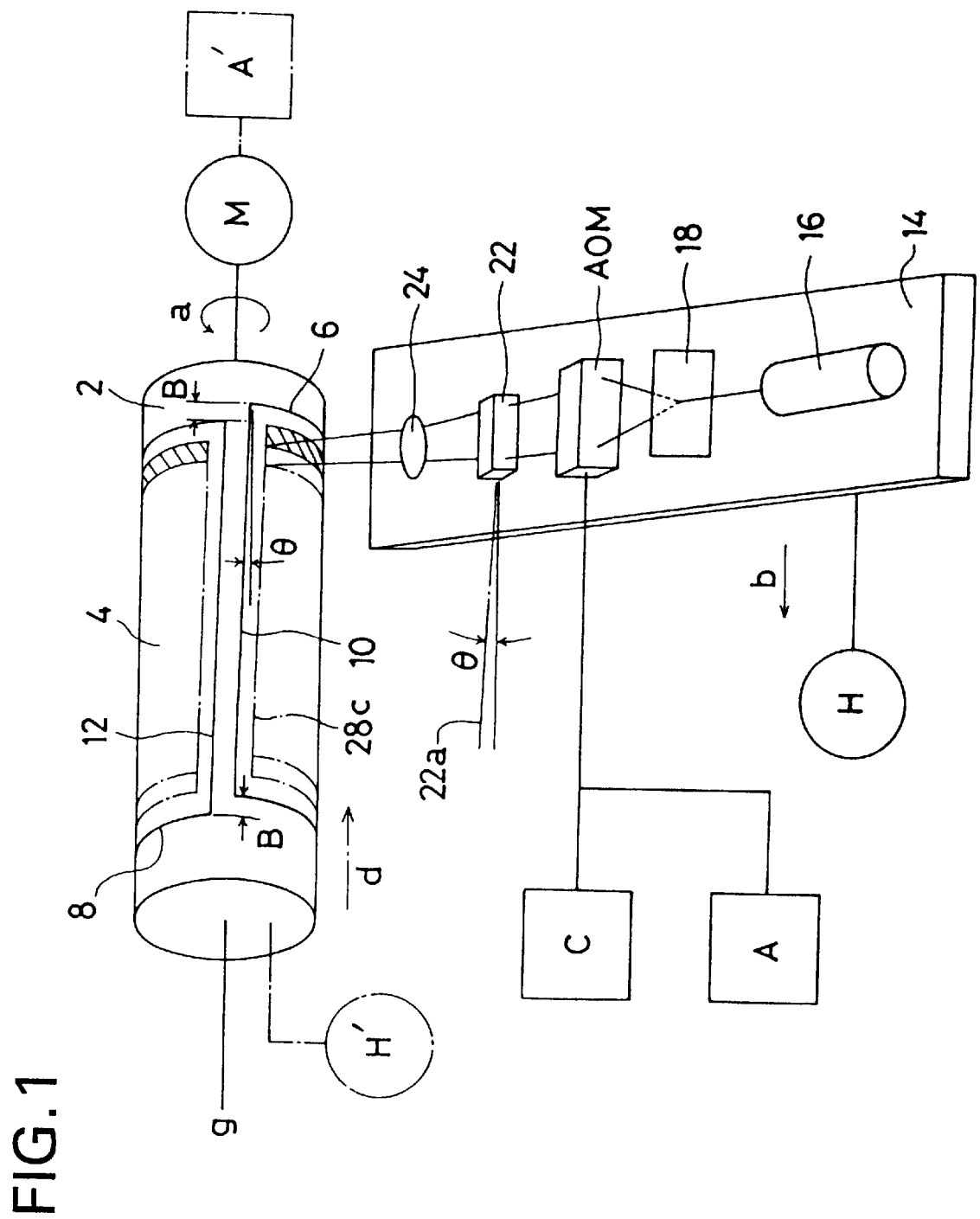
FIG. 1 is a schematic, isometric block diagram showing one example of a printing plate exposure apparatus of this invention.
Figure 11:
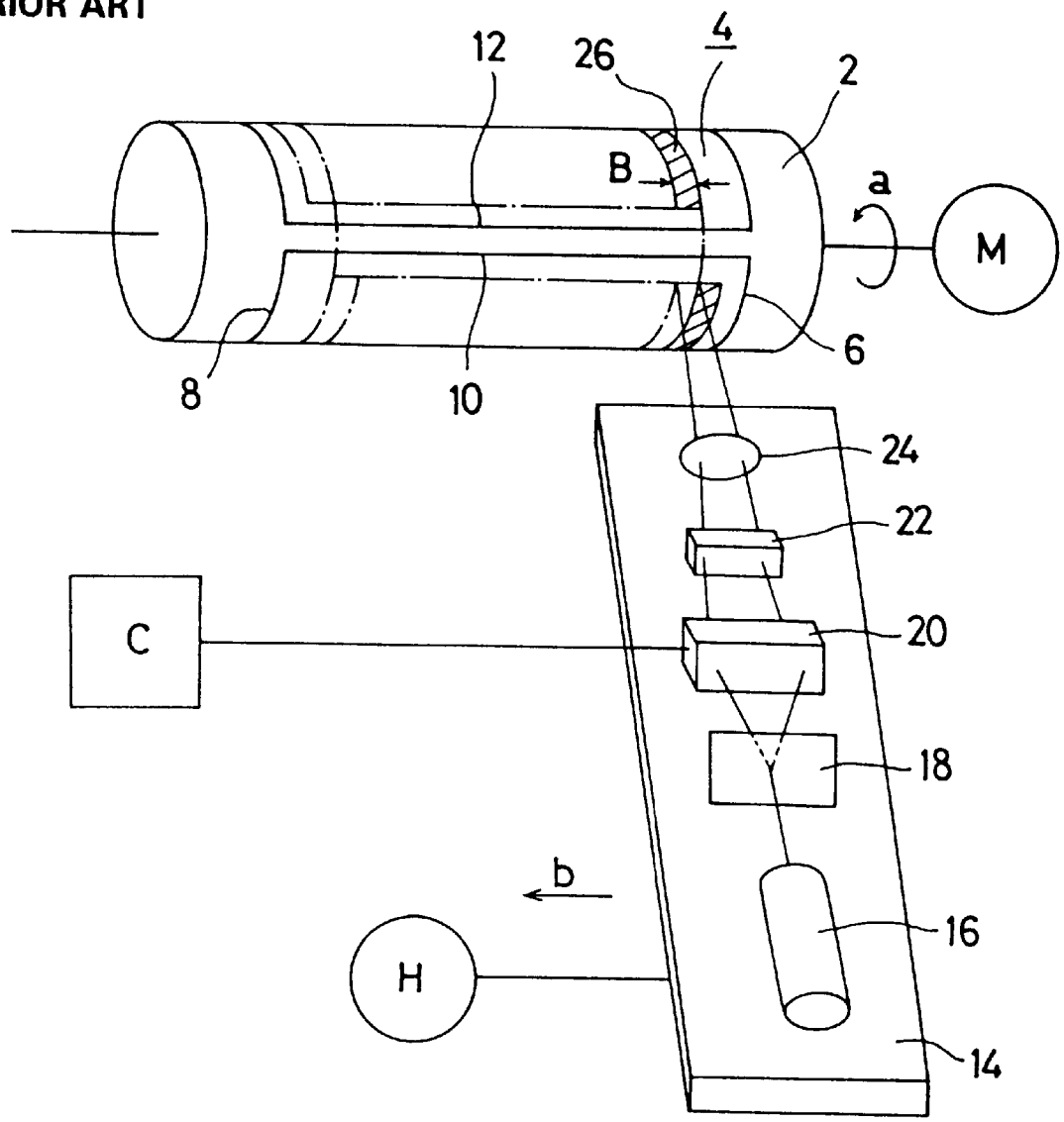
FIG. 11 is a schematic, isometric, construction view of an exemplary printing plate exposure unit of the prior art.
Figure 12A:
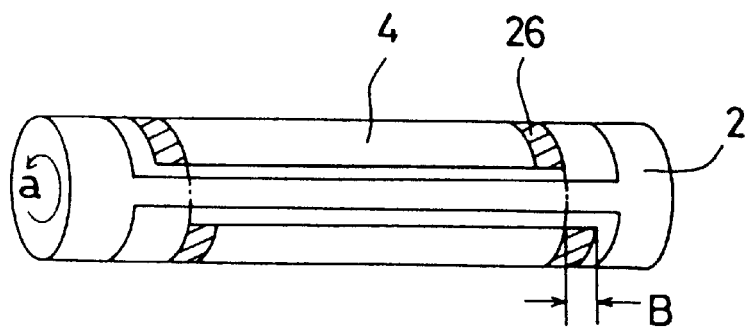
FIG. 12A is a schematic, isometric, view of a drum and printing plate of the prior-art device of FIG. 11.
Figure 12B:
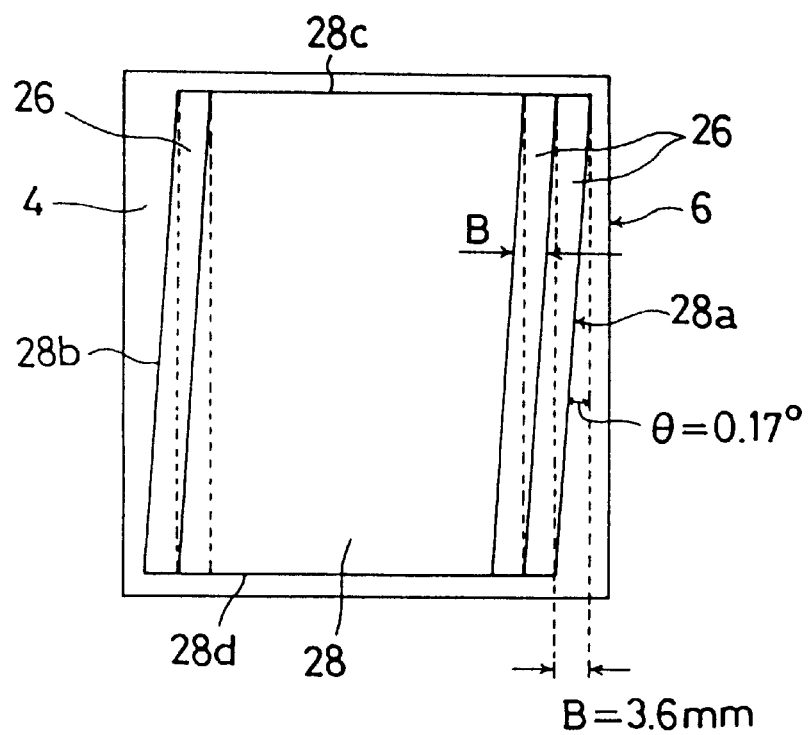
FIG. 12B schematically shows a printing plate with a recording image thereon for illustrating an oblique distorted shape of a recording image formed on a printing plate using the prior-art apparatus of FIG. 11; and, FIGS. 13A and 13B are views similar to those of FIGS. 12A and 12B, but showing the removal of distortions of the recording image by intermittently moving the exposure unit.
Figure 13A:
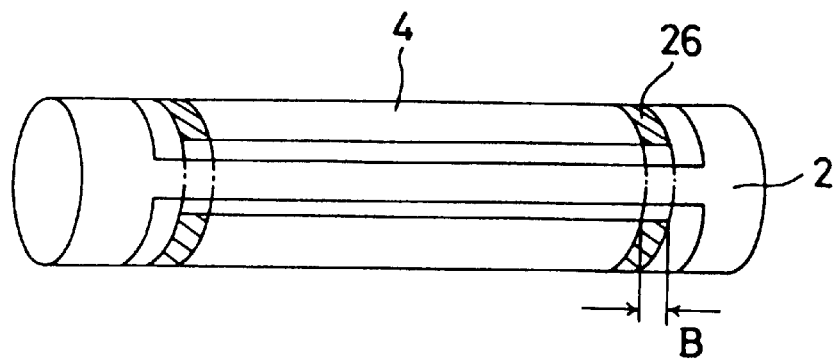
Figure 13B:
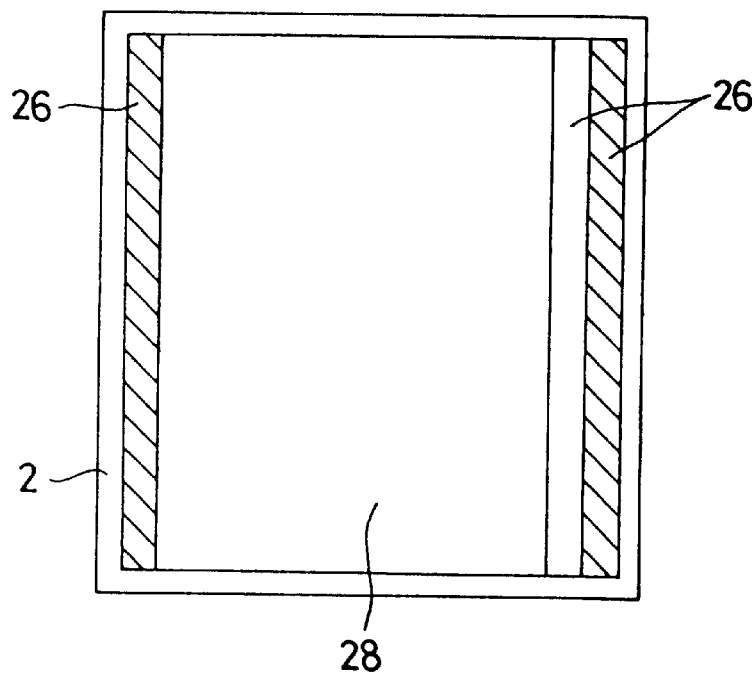

FIG. 1 is a view of an embodiment of the present invention, with parts thereof which are similar to the parts shown in the prior-art device of FIG. 11 (explained above) being designated by the same reference numerals as in FIG. 11 and not being explained again. Only different parts are explained.

Referring now to FIG. 1, a printing plate 4, wound on an external circumferential face of a drum 2, is wound spirally such that a start side edge line 6 thereof is shifted by a distance of a band width B after one revolution of the drum, i.e., at the completion of winding the plate 4 in its circumferential entirety. Therefore, an end side edge line 8 is also shifted by a distance of the band width B. A top edge line 10 and a bottom edge line 12 of the printing plate 4, parallel to each other on the drum's circumferential face, are both inclined by an aforementioned angle θ relative to a drum axial direction "g". An axial line 22a of the light source array used as the exposure unit 22 is arranged to be parallel to the top edge line 10, and hence the array is inclined by the angle θ relative to the drum axial direction.

The top edge line 28c of the recording image 28 is made to be parallel to, at a uniform interval from, the top edge line 10 of the printing plate 4 by adjusting, with a timing mechanism A, a recording start position of an image band 26 for each rotation of the drum 2.

Figure 2A:
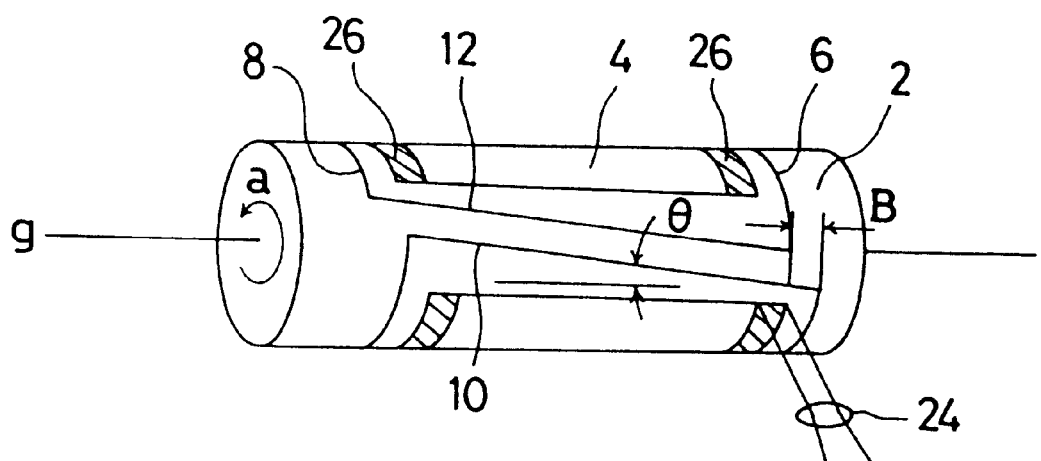
FIGS. 2A and 2B are schematic, diagrammatic, views of elements of the apparatus of FIG. 1 for emphatically illustrating an inclination arrangement of a printing plate to a drum.
Figure 2B:
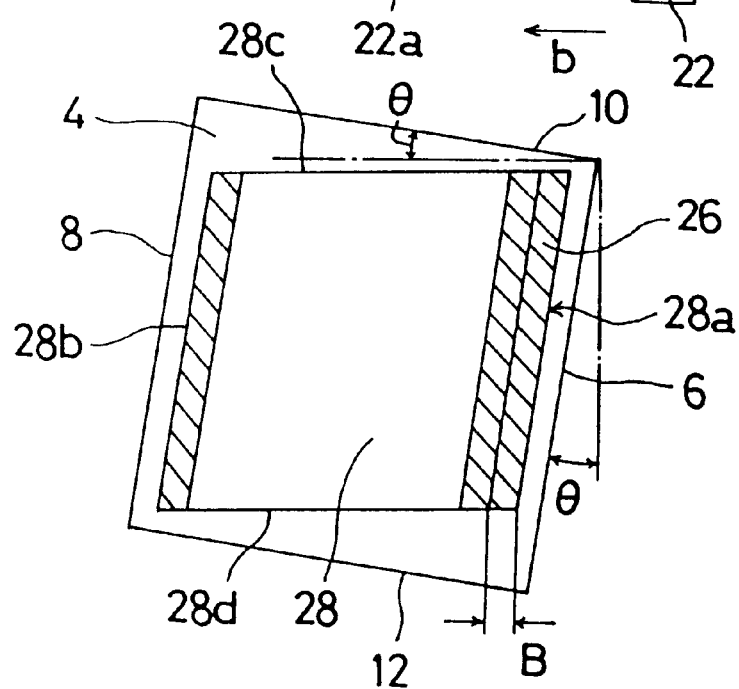

FIGS. 2A and 2B illustrate an emphasized inclination arrangement of the printing plate 4 of FIG. 1. A preliminary stage is shown in FIG. 2A wherein the axial line 22a of the exposure unit 22 is not inclined, but is arranged in parallel with the drum axial direction "g". Since the exposure unit 22 moves at a constant speed through a distance of the band width B in a direction of the arrow "b", parallel to the axial direction, for each revolution of the drum 2, the image band 26 is recorded spirally, as shown in FIG. 2B, with each band being positioned adjacent a previous one for continuously recording the image 28 laterally, and hence the recorded image 28 is formed within the printing plate 4. Although the start side edge line 6 of the printing plate 4 and the end side edge line 8 thereof are formed respectively in parallel to the start side edge line 28a of the recording image 28 and the end side edge line 28b thereof, the top lines 10 and 28c, and the bottom edge lines 12 and 28d are skewed by the angle θ relative to each other.

Figure 3A:
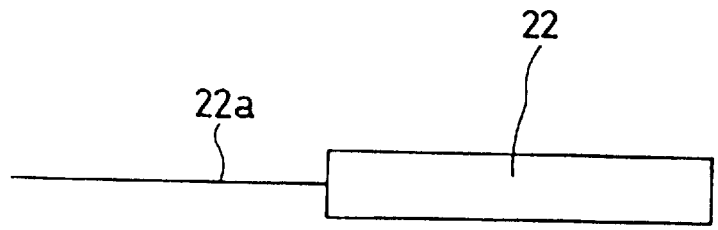
FIG. 3A is a schematic block diagram for illustrating an axial line of an exposure unit of FIG. 1 being aligned in a drum axial direction and FIG. 3B is a diagrammatic representation illustrating a recording of image data, in one embodiment, when the axial line of the exposure unit is arranged in the drum axial direction.

To remove this skewness, an inventive first-embodiment method for removing the inclination of the recording image 28 relative to the printing plate 4 by the timing mechanism A will be described, with the axial line 22a of the exposure unit 22 being oriented as shown in FIG. 3A in the drum axial direction, as in FIG. 2.

The inclined recording can be corrected by using the timing mechanisms A to make earlier a start of recording by the exposure unit 22, by a given time period, for each revolution of the drum 2. As can be seen in 3B, a first image band 26-1 is recorded when the printing plate 4 wound on the drum 2 is moved in an arrow "c" direction, in accordance with the rotation of the drum. So that the top edge line 28c of the recording image 28 can be at a line, shown as a dot-dash line in the drawing, a second image band 26-2 starts the recording operation earlier by B sin θ on the circumference in advance of a position where a previous revolution was completed. The recording start timing has to be made earlier by $\Delta t = (B \sin \theta / D) T$, where a time required for one revolution (rotation period) is T, and a drum circumference length is D.

Calculated based on data from conventional examples, $\Delta t=5.4\times10^{-6}$ seconds is obtained from B=0.14 inch, D=46 inches, θ=0.17 degree, and T=0.6 second (revolution number: 100 rpm). When a lateral width of the recording image 28 is 16 inches, the number of recording bands is n=16/0.14=114, and the advanced time for the last band is 113 $\Delta t=6.1\times10^{-4}$ seconds. That is, the recording of each band is cumulatively advanced by $\Delta t$ for each revolution.

Figure 4:
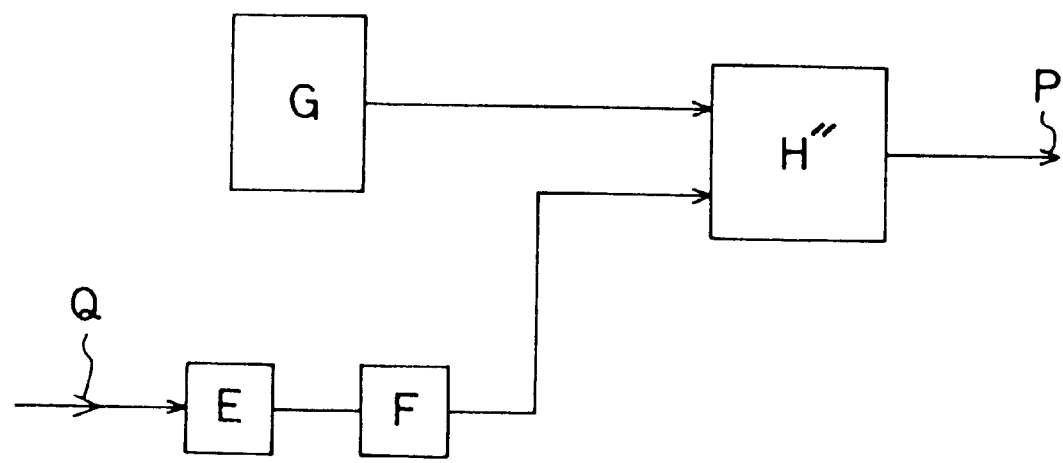
FIG. 4 is a block diagram shown one example of a timing mechanism of a system for adjusting a start time to record an image.

This time controlling operation can be conducted easily with the use of known clock art. FIG. 4 is another embodiment of the timing adjusting method. This method includes the step of inputting into a memory controlling unit F a record starting command signal Q from a position detecting sensor (not shown) on the drum through a variable time delay unit E, and thereby adjusting timing of an output of the image signal P from a memory unit G through a buffer memory H".

Figure 5:
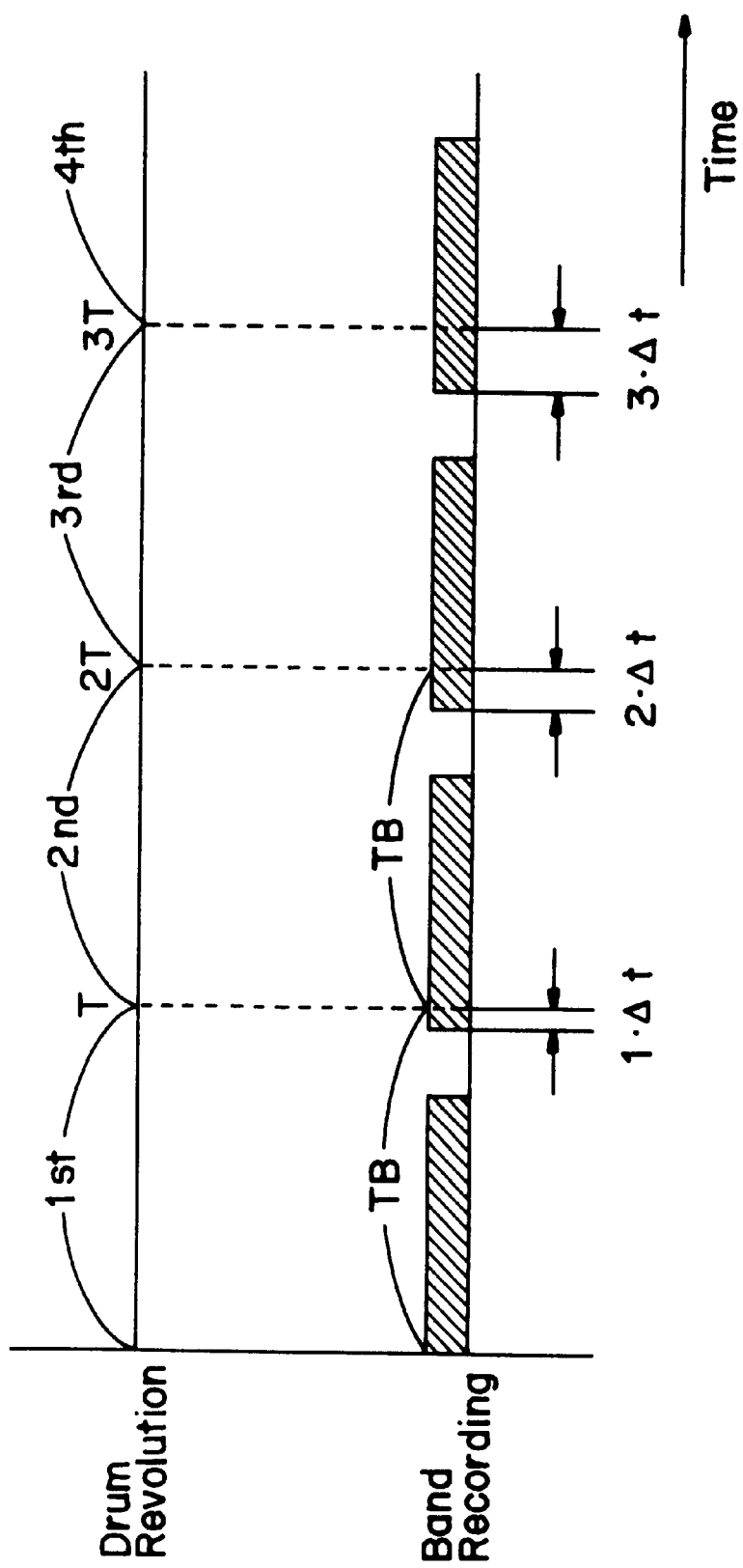
FIG. 5 is a timing chart of drum revolutions and band recordings.

The aforementioned recording start timing for each band will be described with use of the timing diagram of FIG. 5. The rotation period T of the drum 2 is constant. The recording operation for a first revolution starts simultaneously with start of the first revolution shown. As is shown, the timing advances cumulatively, by $\Delta t$ for a second revolution recording, $2\Delta t$ for a third revolution recording, $3\Delta$ for a fourth revolution recording, etc. Even though the start of the recording operation is gradually advanced, the band period TB, which is the time length of the band, is always constant.

Figure 6:
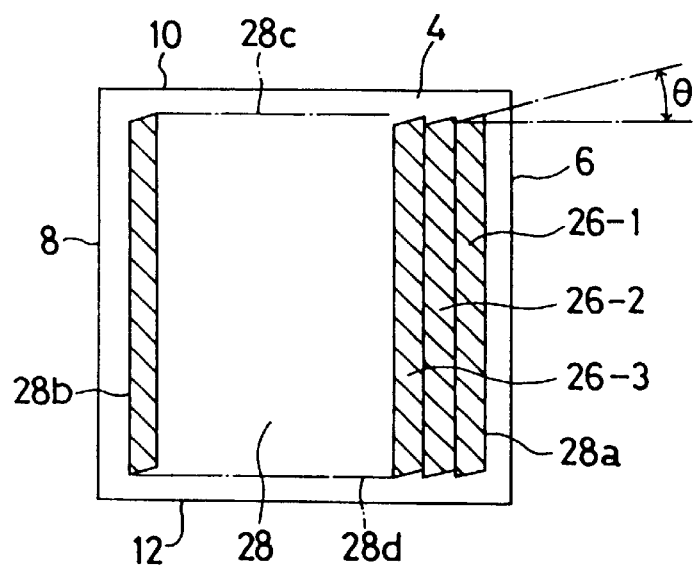
FIG. 6 is a diagram illustrating an image recorded on a printing plate when the axial line of the exposure unit is arranged in a drum axial direction.

A printing plate 4 drawn in this manner is shown in FIG. 6. It can be seen from a comparison between the printing plate 4 of FIG. 6 and the recording image 28 of FIG. 6 that the top edge lines 10, 28c, the bottom edge lines 12, 28d, the start side edge lines 6, 28a, and the end side edge lines 8, 28b of the printing plate and the recording image 28 are basically parallel to each other, and that the recording image 28 is a regular quadrangle. But the upper and lower sides of each image band are inclined by an angle θ. But the inclination angle θ is extremely small at 0.17 degree. The band width B is 0.14 inches =3.6 mm. The inclined angle is not conspicuously visible to readers.

There is a method of delaying the rotation speed of the drum 2, as another example of a timing mechanism A'. As is shown in FIG. 5, the drum revolution period T is longer by $\Delta t$ than the band period TB. If the band period TB, which remains constant, is used as the standard timing (i.e., if timing adjustment is carried out on the basis of the band period TB), the drum is to be positioned short of completion of one revolution by $\Delta t$ in time, or B sin θ in distance, at a time of completion of one cycle of the band. If the revolution period T of the drum is allowed to be D/(D-B sin θ) times as long as the standard timing TB (band period), a proper timing operation can be carried out. Since this applies to each band if rephrased from a stand point of frequency, the timing adjustment can be realized by slowing the rotation speed of the drum to be equal to (D-B sin θ)/D times as fast as the frequency of the standard timing.

Figure 7:
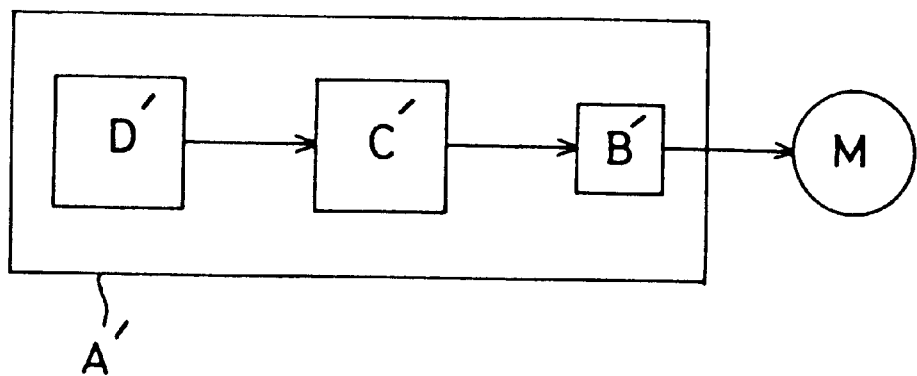
FIG. 7 is a block diagram showing one example of a timing mechanism being operated according to this invention by controlling rpm's of a motor.

A timing mechanism A' of a system for delaying drum rotation speed is shown in dot-dash line in FIG. 1. A concrete example of the timing mechanism A' is shown in FIG. 7, wherein the mechanism A' is directly connected with a motor M for rotating the drum 2. A frequency of a crystal oscillator D' is divided by a frequency divider C', and a phase of a motor input is adjusted with a phase shifter B' to control rpm's of the motor M. The aforementioned crystal oscillator D' is different from a crystal oscillator (not shown) for reading a buffer memory from the computer C.

The band period TB, which is constant and serves as the standard timing, is determined by the crystal oscillator for reading the buffer memory. Assuming that its frequency is 10 MHZ, an oscillation frequency of the crystal oscillator D' for determining rpm's of the drum is set at (D-B sin θ)/D times 10 MHz. The timing adjustment can be carried out when a crystal oscillator with an oscillation frequency of 9.9999097 MHZ is used, because a magnification becomes 0.99999097 when the aforementioned values are used as D, B, θ.

Figure 8A:
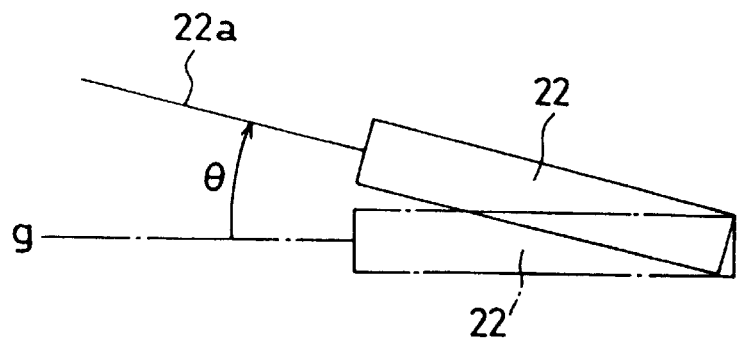
FIG. 8A is an enlarged view illustrating an adjustment of an axial line of an exposure unit for arranging it parallel to a top edge line of the printing plate according to this invention.
Figure 8B:
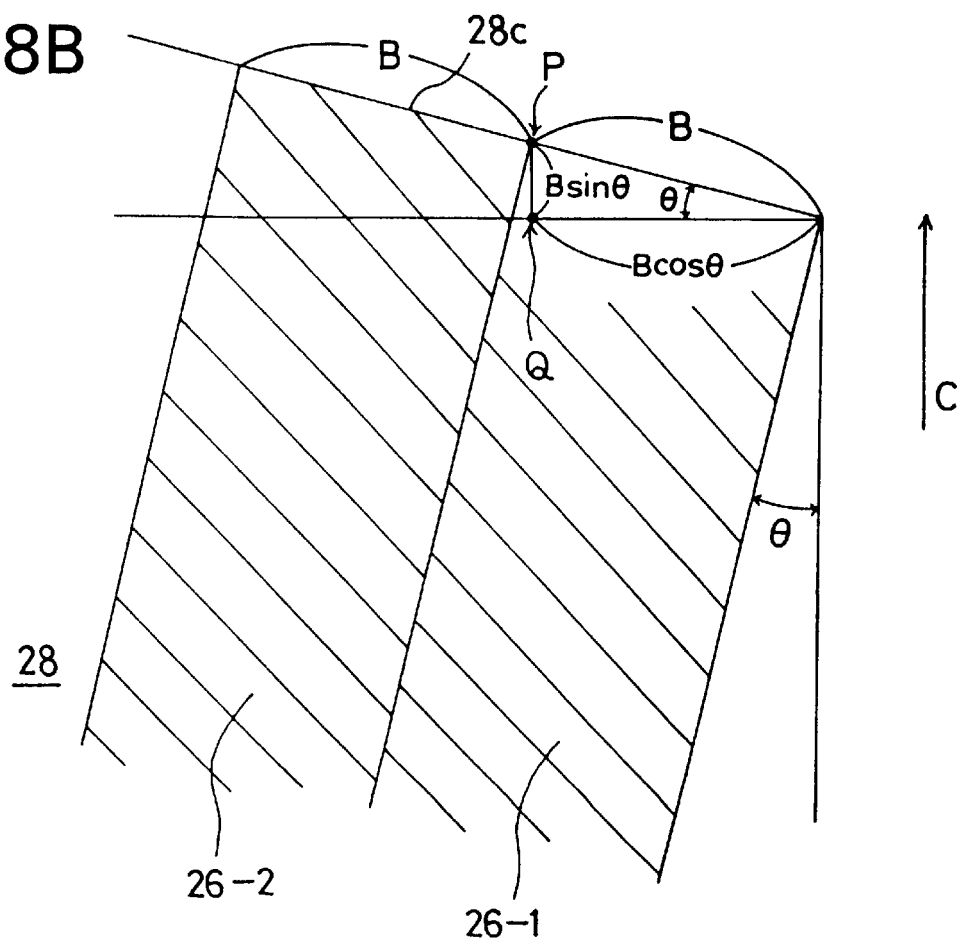
FIG. 8B is a diagrammatic representation illustrating image data when the axis line of the exposure unit is arranged parallel to the top edge line of the printing plate.

A further embodiment of the invention, shown in FIG. 8, can be used to remove the inclination angle (as small as about 0.17 degree) at the upper and lower sides of each band shown in FIG. 6. In this embodiment, the axial line 22a of the exposure unit 22 is inclined by the distortion angle θ relative to the drum axial direction g. That is, the exposure unit 22 is arranged to be inclined so that the axial line 22a is parallel to, or equally spaced from, the top edge line 10 of the printing plate 4. This angle θ, as an extremely small 0.17 degree, is an amount which can be absorbed, disposed of or removed during an assembly adjustment of the drum and the optical system. The top edge line 28c of the recording image 28 is made to be a straight line by this inclination arrangement of the exposure unit 22. The zigzag of the top edge line 28c of FIG. 6 is removed, so as to obtain a recording image with a high degree of perfection.

Figure 9A:
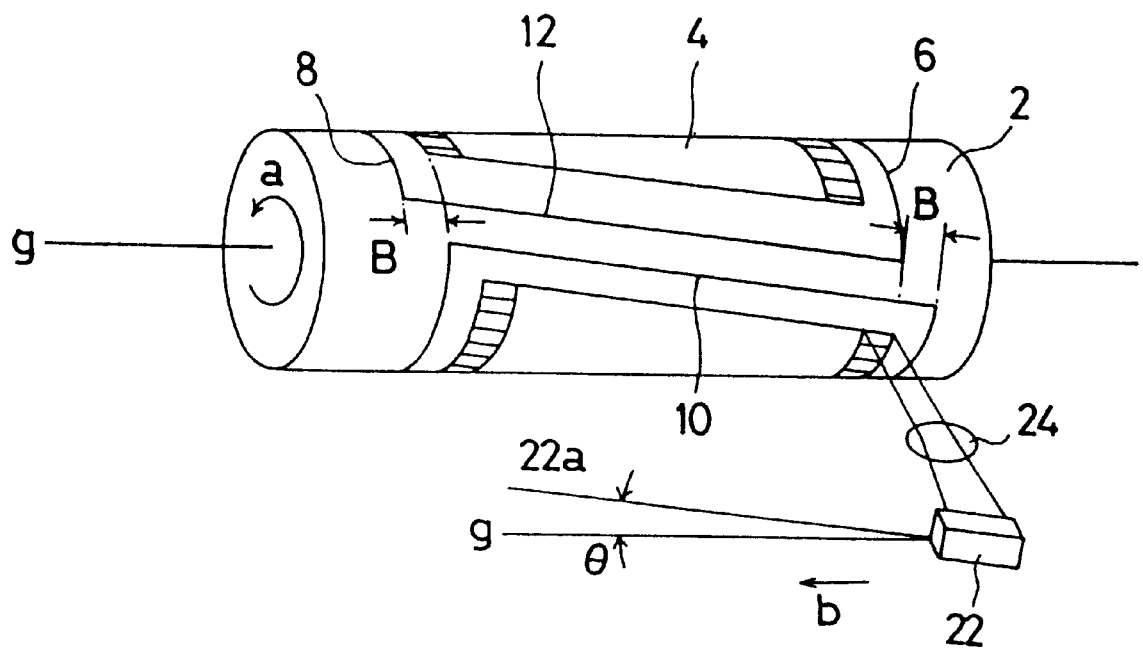
FIG. 9A is a schematic, isometric, view of a drum, printing plate and exposure unit for recording image data with the axial line of the exposure unit being parallel to the top edge line of the printing plate.
Figure 9B:
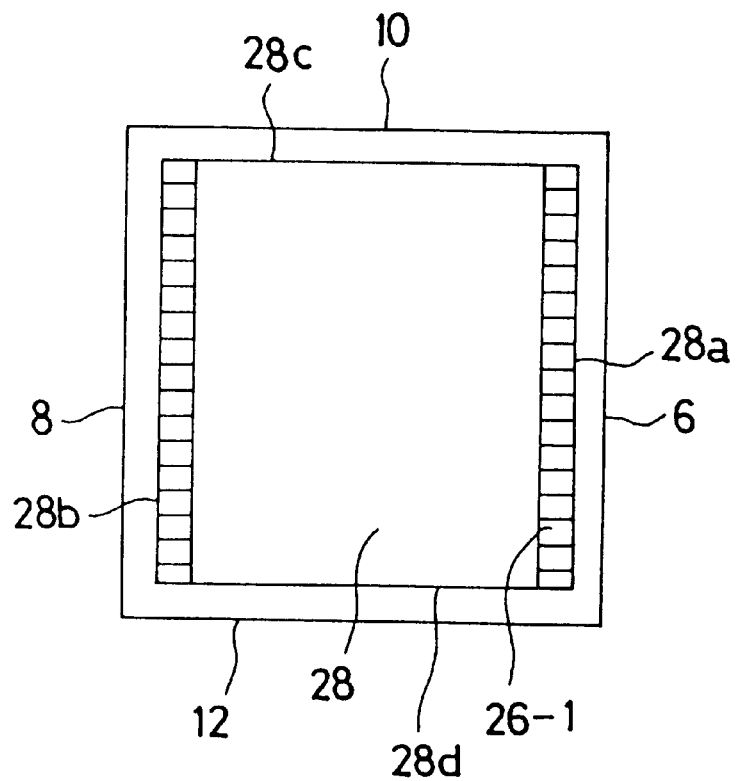
FIG. 9B schematically shows a printing plate with a recording image thereon produced according to the apparatus of FIG. 9A.

FIGS. 9A and B further illustrate this embodiment. The top edge line 10 of the printing plate 4 and the bottom edge line 12 thereof become respectively parallel to the top and bottom edge lines 28c and 28d by such an arrangement as is described above. At the same time, the start and end side edge lines 6 and 8 of the printing plate 4 are also respectively parallel to the start and end side edge lines 28a and 28b of the recording image 28. Accordingly, the recording image 28 can be precisely recorded without distortion with respect to the printing plate 4.

Figure 3B:
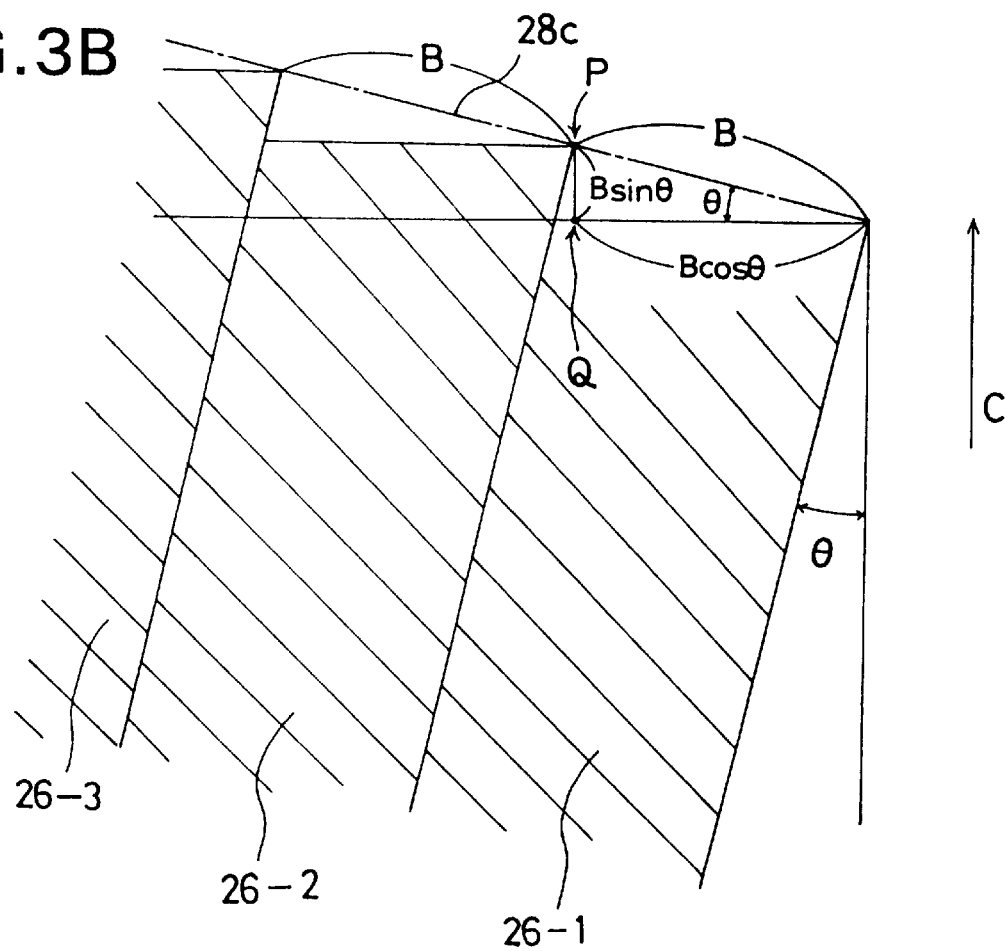

A moving speed of the exposure unit 22 will now be described in detail. As seen in FIG. 3B, the exposure unit 22 is required to reach the position of point P on the printing plate in $0.6-5.4\times10^{-6}$ seconds from starting to record in the first image band 26-1, as the printing plate 4 moves in arrow "c" direction. Thus, the exposure unit 22 has to move in the drum axial direction by B cos θ in this time period. Although the exact moving speed is U=B cos θ/(0.6–5.4×10$^{-6}$) inch/second, there is hardly any difference even if the calculation is carried out with U=B cos θ/0.6. Further, cos θ=0.999996 is obtained from θ=0.17 degree. The calculating operation can be effected with U=B cos θ/0.6. Since the moving speed of the exposure unit 22 can be set so that the exposure unit is moved by a distance of the band width B for one revolution of the drum, it is described in the present application that the exposure unit is moved by a distance of the width of one band for one revolution of the drum.

Figure 10:
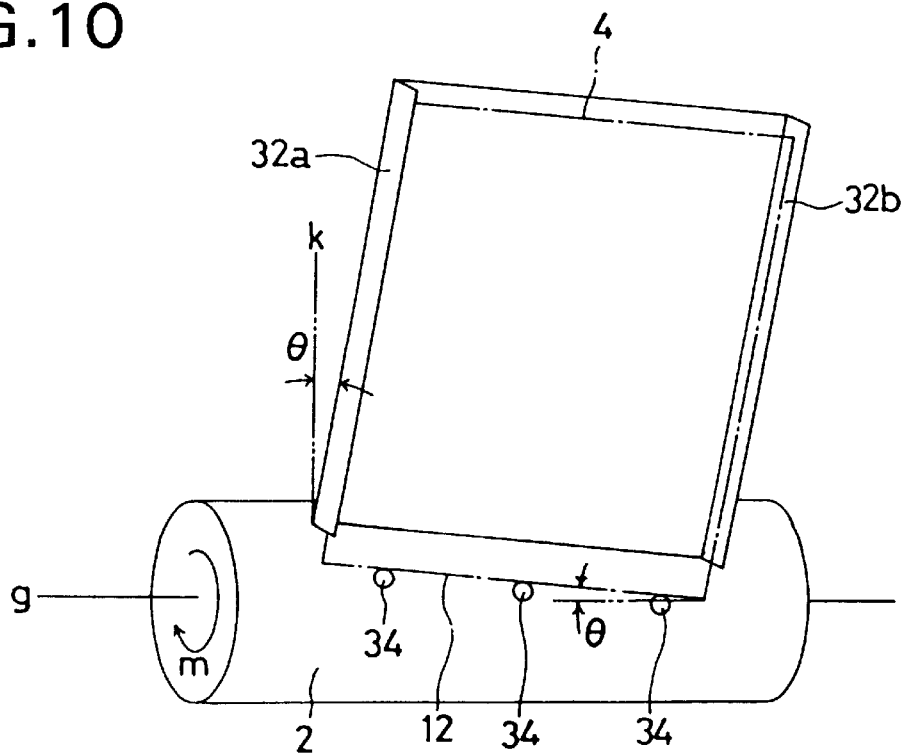
FIG. 10 is a schematic view of a printing plate inclination arrangement mechanism for obliquely winding a printing plate spirally on a drum according to this invention.

FIG. 10 is a schematic view of a printing plate 4, shown in dot-dash lines, including a mechanism arrangement for spirally winding it on the drum 2. The printing plate 4 is wound at an inclination of a given angle with respect to the drum axial direction "g", the inclination angle being set so that the printing plate 4 is relatively shifted by a distance of the band width B when the drum has made one revolution as described above. The angle θ, which is 0.17 degree in this embodiment, can be appropriately changed in accordance with the band width B. A pair of guide rails, 32a and 32b, are arranged in parallel, inclined by the angle θ0 with respect to an orthogonal direction "k" relative to the drum axial direction "g". The printing plate 4 is engaged between the guide rails. After the top edge line 12, which is the leading-edge end of the printing plate 4, has contacted stops 34 on the drum 2, and stopped, the printing plate 4 is spirally wound onto an external circumferential face of the drum 2, while the drum 2 is rotated in an arrow "m" direction, and is secured thereto.

Although the moving mechanism H is adapted to move the optical stand 14 with the exposure unit 22 affixed thereto, the drum 2 can be moved instead in an arrow "d" direction, by a moving mechanism H' shown with the dot-dash line of FIG. 1. Or, moving mechanisms H and H' can be provided on both the drum 2 and the optical stand 14 so that both of them can move at the same time, because the recording operation can be conducted if only the drum 2 and the exposure unit 22 are relatively moved through a distance of one band width for one revolution of the drum. Although the moving speed is preferably constant, when the rpm's of the drum 2 fluctuate, the speed may be changed so that the exposure unit 22 is moved through a distance of a single band width for one revolution of the drum.

Also, there is a system for moving the exposure unit 22 only, or for moving one portion of the optical system together with the exposure unit 22, without moving the optical stand 14 as a whole.

Although in the aforementioned example, the printing plate 4 is wound on the external circumferential face of the drum 2, it can be wound on an inner circumferential face, instead of the external circumferential face. This is called an inner face type, in which lenses and mirrors are placed in the shaft core portion of the drum 2 for reflecting light flux from the exposure unit 22, so as to record the image band on the drum inner face. The inner face type, wherein the optical apparatus is accommodated within the drum, can be made smaller.

In the aforementioned example, the laser beam coming from the laser beam source 16 is made into multi-beams and a light source array composed of optical fibers is used as the exposure unit 22. A light emitting diode, instead of the laser light source, could be used. That is, a light source array with light emitting diodes arranged in one row could be provided to be turned on and off by image signals from the computer C. This is called a light emitting diode array and can be applied to the invention when the light energy output can be made larger. Since the above-mentioned light source array system uses multi-beams, it is advantageous that data of the band width can be simultaneously recorded with the light source array having 128 beams and the band width also having, for example, 128 picture elements.

An exposure unit 22 using a single beam, instead of multi-beams, can also be used. A first system of this type uses a vibration mirror, with the mirror being fixed to a shaft of a vibration motor or galvanometer and a recording operation is conducted by scanning data within the band width, the mirror being vibrated right and left within a micro angle range. A second system, using a polariscope, is called an acoustic optical polariscope (AOD). The polariscope is an exposure unit for diffracting an incident beam, freely changing a grid space with the use of high frequency waves, so as to scan the beam within the band width. The aforementioned vibration mirror and the polariscope can be adopted as the exposure unit 22 of the invention, and other known exposure apparatus other than these can also be used as the exposure unit.

The printing plate exposure apparatus of the invention is not restricted to the aforementioned examples, and includes within the technology range various modified examples, design changes and so on in a range within the scope of the invention.

As described above in detail, the invention can record in parallel with the start side edge line of the printing plate the spirally recorded image bands continuously, because the printing plate is spirally wound obliquely on the drum. Since the timing mechanism is provided for advancing the recording start positions of the image bands for each revolution, the top edge line of the recording image can be formed parallel to the top edge line of the printing plate.

As a result of the above described effects, the image signals from the computer can be recorded in the center of the printing plate as a quadrangular recording image shape, free from distortion. Therefore, the optical system for exposure use is not required to repeat frequent moving/stopping procedures, and can provide a high quality printing plate. Printing distortions, noticed by close examination, of the mass printing matter can be removed. At the same time, this will meet expectations of newspaper companies who desire that start-up times before printing be reduced. The invention can achieve superior practical effects as described above.

I claim:

1. A printing plate exposure apparatus for recording image data spirally in recording bands, having a predetermined band width, so as to form a plurality of picture elements on a surface of a substantially rectangular printing plate wound on a drum, said apparatus comprising:

a rotatable drum;

a printing plate wound spirally on the drum so that a side edge line extending along a side edge of the printing plate is shifted by a distance of the band width for one revolution of the drum;

an exposure unit for recording image data in a band on the printing plate;

a moving mechanism for moving the exposure unit a distance of the band width along a drum axial direction relative to the drum for each revolution of the drum; and, a timing mechanism for adjusting a recording starting position of each record band for each revolution of the drum, thereby allowing a top edge line of recorded image data to be substantially parallel with a top edge line of the printing plate;

wherein the exposure unit is arranged to project an image aligned to the top edge of the printing plate;

wherein the timing mechanism comprises a system for advancing a recording starting time of each band by a given time period for each revolution of the drum;

wherein an axial line of the exposure unit is arranged to be parallel to the top edge of the printing plate; and wherein the timing mechanism includes a variable time delay unit for receiving position signals of the drum and delaying each position signal by a different amount to advance the recording starting time of each band so that said top edge line of recorded image data is substantially parallel to the top edge line of the printing plate.

2. A printing plate exposure apparatus according to claim 1, wherein is further included a printing plate inclining arrangement mechanism which comprises:

a pair of guide rails positioned adjacent the drum for engaging opposite side edges of the printing plate for guiding the printing plate onto the drum, said guide rails being inclined by a given angle with respect to an orthogonal direction to the drum axial direction; and a stop at the drum for stopping a leading edge of the printing plate at the drum when the printing plate is put through the guide rails for properly positioning the printing plate on the drum.

3. A printing plate exposure apparatus according to claim 1, wherein the moving mechanism moves the exposure unit at a constant speed along the drum axial direction relative to the drum which does not move axially.

4. A printing plate exposure apparatus according to claim 1, wherein the printing plate is wound on an external circumferential face of the drum.

5. A printing plate exposure apparatus according to claim 1, wherein the printing plate is wound on an inner circumferential face of the drum.

6. A printing plate exposure apparatus according to claim 1, wherein the exposure unit is a light source array comprising one of a laser beam source and a light emitting diode.

7. A printing plate exposure apparatus according to claim 1, wherein the exposure unit includes a vibration mirror.

8. A printing plate exposure apparatus according to claim 1, wherein the exposure unit includes a polariscope.

* * * * *